(12) United States Patent
Aoki et al.

(10) Patent No.: US 11,208,733 B2
(45) Date of Patent: Dec. 28, 2021

(54) TRANSPARENT COMPLEX OXIDE SINTERED BODY, MANUFACTURING METHOD THEREOF, AND MAGNETO-OPTICAL DEVICE

(71) Applicant: Shin-Etsu Chemical Co., Ltd., Tokyo (JP)

(72) Inventors: Shinji Aoki, Annaka (JP); Keita Tanaka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 374 days.

(21) Appl. No.: 16/288,608

(22) Filed: Feb. 28, 2019

(65) Prior Publication Data
US 2019/0276949 A1   Sep. 12, 2019

(30) Foreign Application Priority Data
Mar. 9, 2018   (JP) .............................. JP2018-043046

(51) Int. Cl.
| | | |
|---|---|---|
| *C30B 13/34* | (2006.01) | |
| *C04B 35/505* | (2006.01) | |
| *C04B 35/64* | (2006.01) | |
| *C30B 13/24* | (2006.01) | |
| *C30B 15/00* | (2006.01) | |
| *G02B 5/30* | (2006.01) | |
| *G02B 27/28* | (2006.01) | |
| *G02F 1/00* | (2006.01) | |
| *C04B 35/50* | (2006.01) | |
| *C04B 35/626* | (2006.01) | |
| *C04B 35/645* | (2006.01) | |
| *G02F 1/09* | (2006.01) | |
| *C09K 11/77* | (2006.01) | |

(52) U.S. Cl.
CPC .............. *C30B 13/34* (2013.01); *C04B 35/50* (2013.01); *C04B 35/505* (2013.01); *C04B 35/6265* (2013.01); *C04B 35/6268* (2013.01); *C04B 35/62645* (2013.01); *C04B 35/62685* (2013.01); *C04B 35/64* (2013.01); *C04B 35/6455* (2013.01); *C09K 11/7769* (2013.01); *C30B 13/24* (2013.01); *C30B 15/00* (2013.01); *G02B 5/3033* (2013.01); *G02B 27/28* (2013.01); *G02F 1/0036* (2013.01); *G02F 1/09* (2013.01); *C04B 2235/3205* (2013.01); *C04B 2235/3206* (2013.01); *C04B 2235/3208* (2013.01); *C04B 2235/3213* (2013.01); *C04B 2235/3215* (2013.01); *C04B 2235/3224* (2013.01); *C04B 2235/3225* (2013.01); *C04B 2235/3232* (2013.01); *C04B 2235/3244* (2013.01); *C04B 2235/3852* (2013.01); *C04B 2235/444* (2013.01); *C04B 2235/445* (2013.01); *C04B 2235/604* (2013.01); *C04B 2235/658* (2013.01); *C04B 2235/6581* (2013.01); *C04B 2235/6583* (2013.01); *C04B 2235/661* (2013.01); *C04B 2235/662* (2013.01); *C04B 2235/663* (2013.01); *C04B 2235/664* (2013.01); *C04B 2235/762* (2013.01); *C04B 2235/9653* (2013.01)

(58) Field of Classification Search
CPC ..... C09K 11/7769; G02F 1/0036; G02F 1/09; C04B 35/505; C04B 35/50; C04B 35/62645; C04B 35/6265; C04B 35/62675; C04B 35/6268; C04B 35/6455
See application file for complete search history.

(56) References Cited

U.S. PATENT DOCUMENTS

| | | | |
|---|---|---|---|
| 7,166,162 B2 | 1/2007 | Sekijima et al. | |
| 8,753,538 B2 | 6/2014 | Makikawa et al. | |
| 9,470,915 B2 | 10/2016 | Makikawa et al. | |
| 10,642,073 B2 * | 5/2020 | Makikawa | ............ C01F 17/224 |

FOREIGN PATENT DOCUMENTS

| | | | |
|---|---|---|---|
| EP | 1 544 328 A1 | | 6/2005 |
| EP | 2 492 378 A1 | | 8/2012 |
| EP | 2492378 | * | 8/2012 |
| EP | 2 687 500 A1 | | 1/2014 |
| JP | 2002-293693 A | | 10/2002 |
| JP | 4107292 B2 | | 6/2008 |
| JP | 2011-213552 A | | 10/2011 |
| JP | 5393271 B2 | | 1/2014 |
| JP | 5704097 B2 | | 4/2015 |
| WO | 2015/186656 A1 | | 12/2015 |
| WO | WO 2015186656 | * | 12/2015 |

OTHER PUBLICATIONS

Wu et al., "Optical and fluorescent properties of Y2O3 sol-gel planar waveguides containing Tb3+ doped nanocrystals". Applied Physics A: Materials Science & Processing, 2007, 87, pp. 697-704, cited in Specification (8 pages).

* cited by examiner

*Primary Examiner* — C Melissa Koslow
(74) *Attorney, Agent, or Firm* — Westerman, Hattori, Daniels and Adrian, LLP

(57) ABSTRACT

A transparent complex oxide sintered body is manufactured by sintering a compact in an inert atmosphere or vacuum, and HIP treating the sintered compact, provided that the compact is molded from a source powder based on a rare earth oxide: $(Tb_xY_{1-x})_2O_3$ wherein $0.4 \le x \le 0.6$, and the compact, when heated in air from room temperature at a heating rate of 15° C./min, exhibits a weight gain of at least y % due to oxidative reaction, y being determined by the formula: $y=2x+0.3$. The sintered body has a long luminescent lifetime as a result of controlling the valence of Tb ion.

13 Claims, 4 Drawing Sheets

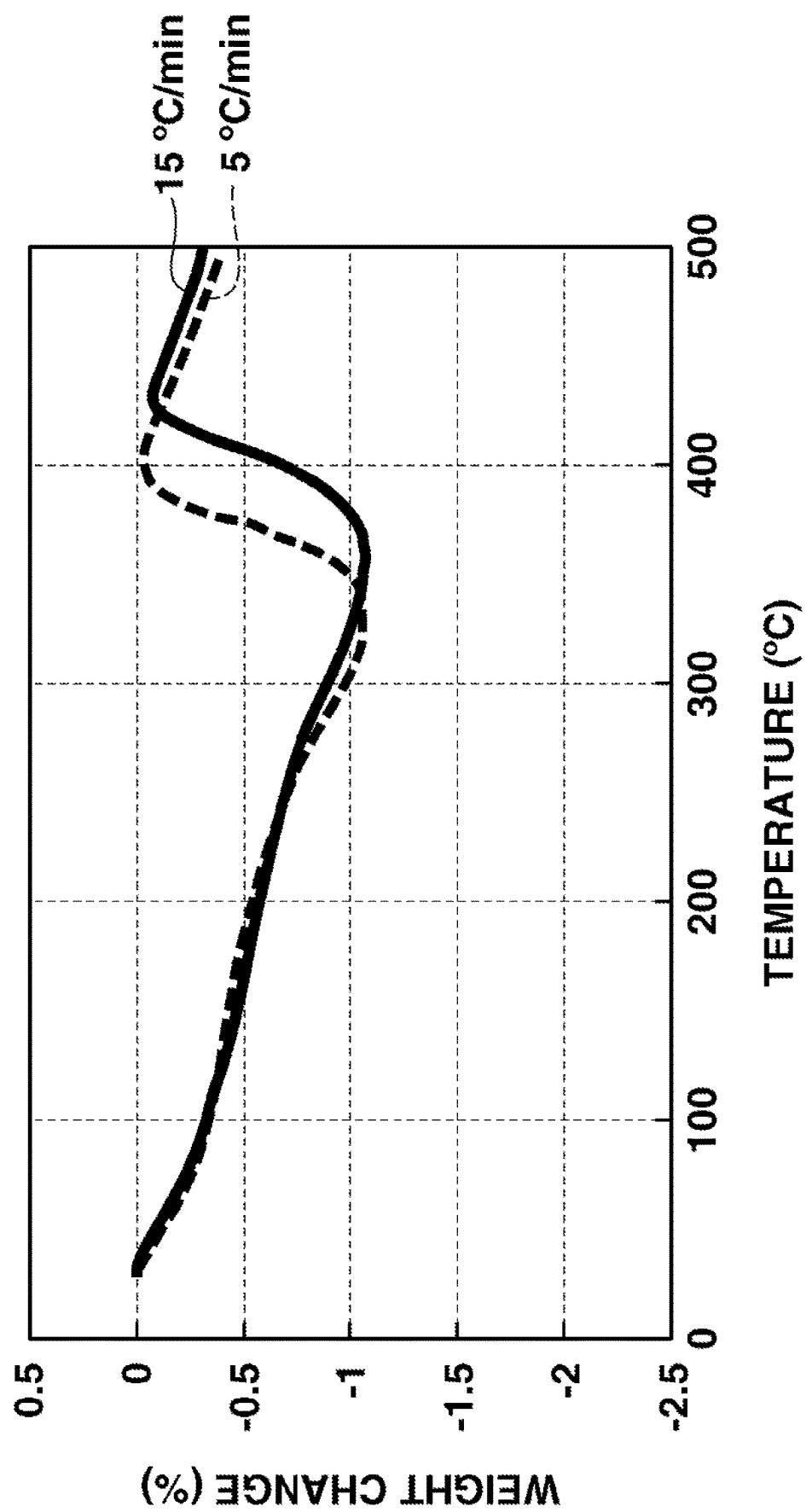

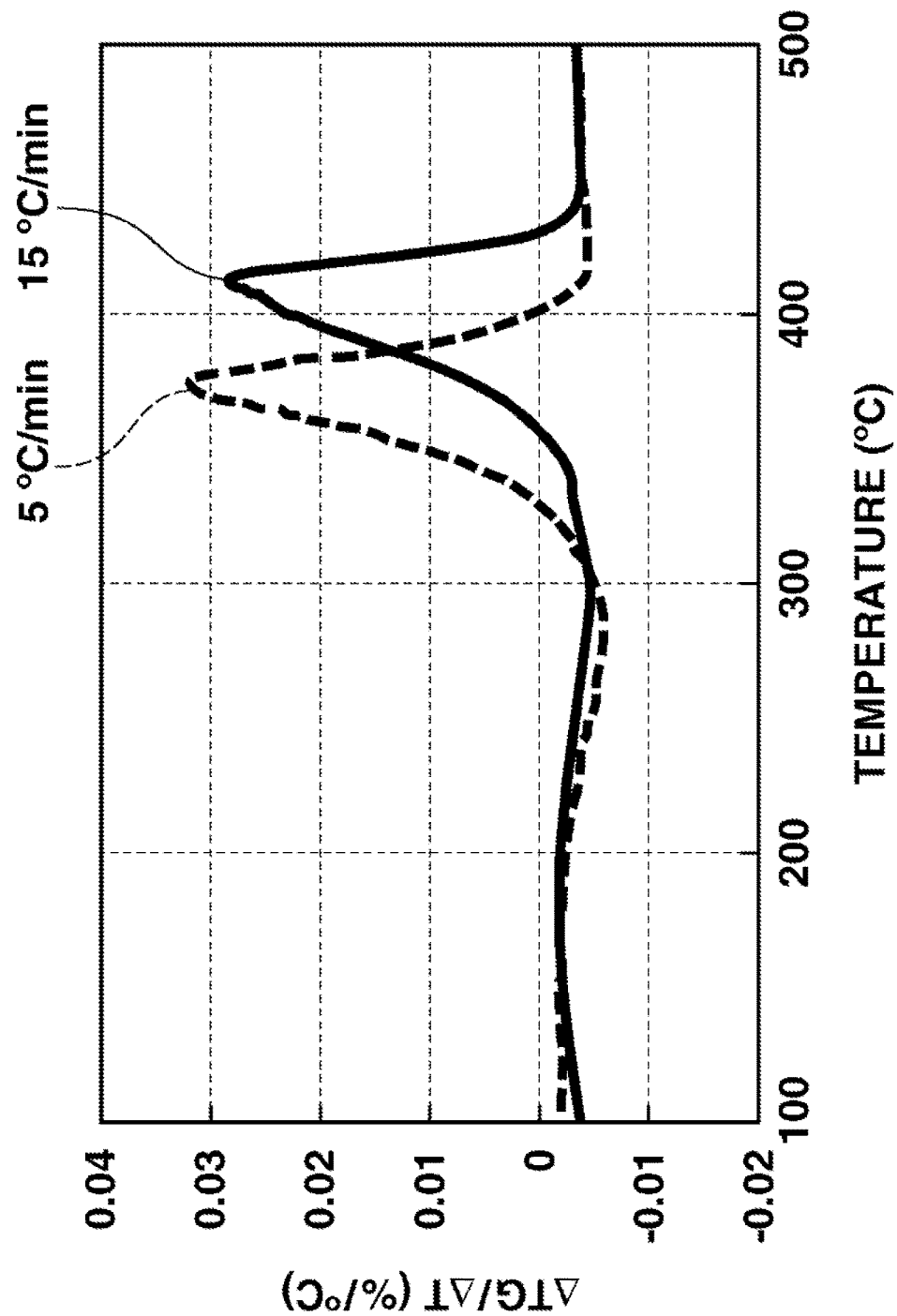

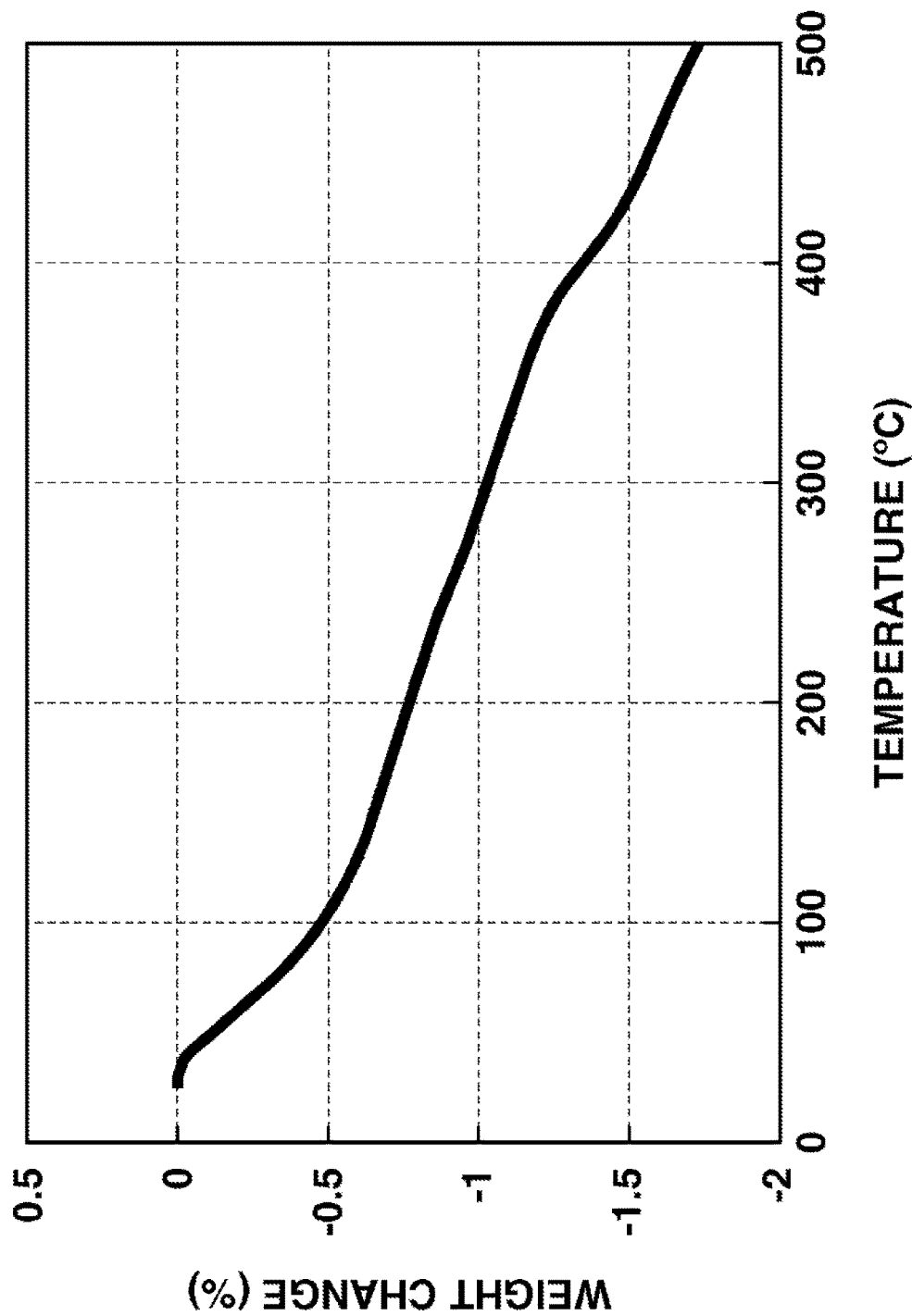

TRANSPARENT COMPLEX OXIDE SINTERED BODY, MANUFACTURING METHOD THEREOF, AND MAGNETO-OPTICAL DEVICE

CROSS-REFERENCE TO RELATED APPLICATION

This non-provisional application claims priority under 35 U.S.C. § 119(a) on Patent Application No. 2018-043046 filed in Japan on Mar. 9, 2018, the entire contents of which are hereby incorporated by reference.

TECHNICAL FIELD

This invention relates to a method for manufacturing a transparent sintered body of complex oxide $(Tb_xY_{1-x})_2O_3$ which is light transmissive in a visible to infrared region and suited for use in the optical application as magneto-optical device material.

BACKGROUND ART

Laser beam machining now draws a great attention since it is capable of machining with minimal residual strain and thermal deformation by taking the advantage of a non-contact process which is easy to control the energy density and irradiation time. Efforts are made on laser machines to increase their output, with the range of the machining application expanding from imprinting to cutting. As the output of laser machines is increased, a thermal lens effect can occur even with slight absorption, which requires that the optical members used therein be of high quality. The thermal lens effect is a phenomenon that an optical material is heated upon absorption of a high-power laser beam, causing a gradient of refractive index, whereby the focal length varies during laser machining. Since a variation of focal length causes instability to laser oscillation and degradation to machining accuracy, optical members which are amenable to the thermal lens effect cannot be used in the high-power application.

Among optical members mounted in the laser machine, the magneto-optical device also known as optical isolator is an important optical member because a laser beam is transmitted by the device and its quality is directly coupled with the quality of laser machining. The optical isolator is an optical member which prevents return light reflected within the optical system or by target material from entering the light source interior. If the return light enters the light source, the laser oscillation becomes instable, failing to achieve a high accuracy of machining.

The optical isolator is a magneto-optical device comprising a polarizer, a Faraday rotator, an analyzer, and a magnet. When a laser beam enters the optical isolator, it passes therethrough in the order of polarizer, Faraday rotator, and analyzer. At this point, if a magnetic field parallel to the traveling laser beam is applied to the Faraday rotator, the Faraday effect that the plane of polarization is rotated in the Faraday rotator takes place. Due to the Faraday effect, the laser beam transmitted by the polarizer is rotated by +45 degrees relative to the traveling direction, before it passes through the analyzer. The return light enters the isolator again from the analyzer and passes through the Faraday rotator. At this point, the return light is further rotated by +45 degrees. This rotation combined with the initial +45 degree rotation gives a total rotation angle of +90 degrees. Since the plane of polarization of the return light is at a right angle with respect to the polarizer, the return light is not transmitted by the polarizer. This prevents the return light from entering the light source.

The rotation angle θ of polarization plane due to the Faraday effect is represented by the following formula (A).

$$\theta = V * H * L \tag{A}$$

In formula (A), θ is a Faraday rotation angle, H is a magnetic flux density, L is the length of the Faraday rotator, and V is the proportionality constant or Verdet constant which is determined by the material of the Faraday rotator. For use as an optical isolator, the Faraday rotator length L or magnetic flux density H is determined so as to give θ=45 degrees. This means that a high value of Verdet constant V enables size reduction because the desired isolation is accomplished even when the Faraday rotator and magnet are of small size. In the high-power application, there is the desire for a material having a high Verdet constant because it enables size reduction and a short span of material is advantageous for light loss.

The Faraday rotator of the optical isolator where the Faraday effect occurs is typically made of terbium-doped glass or terbium gallium garnet (TGG) crystal, as described, for example, in Patent Document 1. The magnitude of the Faraday effect is quantified by the Verdet constant. The TGG crystal has a Verdet constant of 40 rad/(T·m) (0.13 min/(Oe·cm)) and the terbium-doped glass has a Verdet constant of 0.098 min/(Oe·cm). Since the Verdet constant of the TGG crystal is relatively high, it is widely used as a standard Faraday rotator. Besides, terbium aluminum garnet (TAG) crystal is also known. Since the Verdet constant of TAG crystal is about 1.3 times that of TGG crystal, the length of the Faraday rotator may be shortened. Thus the TAG crystal can be used in fiber lasers and is satisfactory in such application (see, for example, Patent Documents 2 and 3).

Besides the foregoing crystals, Patent Document 4 discloses a single crystal oxide of $(Tb_xRe_{1-x})_2O_3$ (wherein $0.4 \leq x \leq 1.0$) and transparent oxide ceramics as the material having a high Verdet constant. The single crystal oxide of $(Tb_xRe_{1-x})_2O_3$ (wherein $0.4 \leq x \leq 1.0$) and transparent oxide ceramics have a Verdet constant which is 1.4 to 2.5 times the Verdet constant of TGG crystal. This material is preferable to the prior art materials because of a possible size reduction.

Patent Document 5 discloses a method for manufacturing an oxide sintered body $(Tb_xRe_{1-x})_2O_3$, comprising the steps of furnishing a starting material having good sinterability and a specific particle size distribution, furnishing a sintering aid capable of promoting sintering and maintaining the ceramic crystal structure cubic, sintering the starting material at an optimum temperature in vacuum or an oxygen-free non-oxidizing atmosphere and then hot isostatic pressing (HIP) the sintered material. In this way, a transparent ceramic material free of birefringence due to phase change of terbium and having high transparency is manufactured.

Also, Patent Document 6 describes a method for manufacturing a sintered body of $(Tb_xRe_{1-x})_2O_3$ oxide. A source powder in which sintering aid and rare earth raw material are uniformly combined by the co-precipitation method is used. A transparent ceramic material of terbium oxide-containing rare earth oxide having improved crystal structure uniformity and a minimal insertion loss is obtained.

The ceramic materials of Patent Documents 5 and 6 are improved in scattering, but are yet slightly absorptive. On use of high-power laser beam, a thermal lens effect can occur even with slight absorption, which causes a decline of machining accuracy. The problem of optical quality, especially minimization of light absorption must be solved before the material can be mounted in high-power laser beam machines.

As discussed above, transparent complex oxide sintered bodies based on terbium oxide and yttrium oxide are slightly absorptive, despite the advantage that an optical isolator of compact size can be formed. Since the thermal lens effect can occur even with such slight absorption, they cannot be used in the high-power application.

CITATION LIST

Patent Document 1: JP-A 2011-213552
Patent Document 2: JP-A 2002-293693
Patent Document 3: JP 4107292 (U.S. Pat. No. 7,166,162, EP 1544328)
Patent Document 4: JP 5393271 (U.S. Pat. No. 8,753,538, EP 2492378)
Patent Document 5: JP 5704097 (U.S. Pat. No. 9,470,915, EP 2687500)
Patent Document 6: WO 2015/186656
Non-Patent Document 1: Applied Physics A: Materials and Processing, 87, 697-704 (2007)

DISCLOSURE OF INVENTION

An object of the invention is to provide a method for manufacturing a transparent complex oxide sintered body, a transparent complex oxide sintered body manufactured thereby, and a magneto-optical device; the transparent complex oxide sintered body being made of terbium oxide-containing rare earth oxide, having a high Verdet constant in the wavelength region of 0.9 to 1.1 μm, and having minimized light absorption in the visible to infrared region.

The presence of tetravalent terbium ($Tb^{4+}$) is believed to be one of the causes for light absorption of terbium-containing complex oxides. In air at room temperature, terbium ions in oxide are stabler in terbium oxide where tetravalent terbium in high oxidation state and trivalent terbium coexist than in $Tb_2O_3$ where terbium exists only in three valence (trivalent terbium ($Tb^{3+}$)). Therefore, in the composition of terbium oxide, not only $Tb_4O_7$, but also $Tb_7O_{12}$, $Tb_{11}O_{20}$ and the like are included. Since these tetravalent terbium-containing oxides show broad absorption from the 1 μm band (intended for isolator operation) to the visible light region, they cause to exacerbate the transmittance of a transparent body if they are present in minute amounts in the transparent body. In order that a transparent terbium-containing complex oxide exhibit minimized light absorption from the 1 μm band to the visible light region, it is necessary to control the valence of terbium ions during manufacture of a sintered body and specifically to minimize or deplete the amount of tetravalent terbium in a $TbYO_3$ complex oxide sintered body.

Also, in the course of manufacturing a $TbYO_3$ complex oxide sintered body, it is effective that the amount of tetravalent terbium is reduced to some extent at the stage of a green compact prior to sintering. Then the desired compact is obtainable.

The content of tetravalent terbium may be compared in terms of luminescent lifetime. Reference is now made to Non-Patent Document 1. When the luminescent lifetime of $TbYO_3$ fired at 400° C. in an oxygen atmosphere is compared with the luminescent lifetime of $TbYO_3$ fired at 700° C. in a hydrogen atmosphere, both excited with excitation light of wavelength 308 nm, the luminescent lifetime of a wavelength 543 nm component is 0.82 ms and 1.39 ms. This means that the sintered body fired at 700° C. in hydrogen atmosphere, which has a less content of tetravalent terbium than the sintered body fired at 400° C. in oxygen atmosphere, has a longer luminescent lifetime than the sintered body fired at 400° C. in oxygen atmosphere. This is because the extinction effect of tetravalent terbium on trivalent terbium luminescence is suppressed. Namely, if the content of tetravalent terbium in the $TbYO_3$ sintered body is high, the fluorescent yield becomes lower or the luminescent lifetime becomes shorter, and inversely, if the content of tetravalent terbium is low, the fluorescent yield becomes higher or the luminescent lifetime becomes longer. These results suggest that by selecting the sintering or firing conditions under which the $TbYO_3$ complex oxide sintered body is manufactured, the valence of terbium ions in the sintered body may be controlled and hence, the content of tetravalent terbium in the sintered body may be minimized. The invention is predicated on these findings.

In one aspect, the invention provides a method for manufacturing a transparent complex oxide sintered body comprising the steps of:

sintering a compact in an inert atmosphere or vacuum, the compact being molded from a source powder based on a rare earth oxide represented by the compositional formula: $(Tb_xY_{1-x})_2O_3$ wherein x is a number from 0.4 to 0.6, a powder sample taken from the compact or a compact prepared under the same condition as the compact, when heated in air from room temperature at a heating rate of 15° C./min, exhibiting a weight gain of at least y % due to oxidative reaction starting from a temperature of at least 250° C., y being determined by the formula (I):

$$y=2x+0.3 \qquad (I), and$$

hot isostatic pressing (HIP) the sintered compact to form a transparent complex oxide sintered body, wherein the sintered body emits light when excited with excitation light of wavelength 380 nm, the light including a component of wavelength 545 nm which has a luminescent lifetime of at least 0.3 ms, and a specimen of 11 mm long made from the sintered body has an overall light transmittance of at least 81.0% at a wavelength of 1,064 nm.

In a preferred embodiment, the source powder further contains a sintering aid comprising an oxide of at least one element selected from Group 2 elements and Group 4 elements.

In a preferred embodiment, the source powder is obtained by furnishing an aqueous solution containing (a) terbium ions, (b) yttrium ions, and (c) ions of at least one element selected from Group 2 elements and Group 4 elements, letting components (a), (b) and (c) co-precipitate from the solution, filtering and oxidizing the co-precipitate.

More preferably, the source powder is obtained by heat treating the co-precipitate or its oxide, the heat treatment including heating in an oxygen-containing atmosphere at a temperature of from 800° C. to less than 1,200° C. and then cooling in an inert atmosphere, vacuum or reducing atmosphere.

In a preferred embodiment, the compact has been subjected to binder burnout at a temperature of up to 350° C. after the molding step.

More preferably, the compact has been subjected to reducing treatment in a reducing atmosphere at a temperature of 100° C. to 350° C. after the burnout step.

In another aspect, the invention provides a transparent complex oxide sintered body obtained by sintering a rare earth oxide represented by the compositional formula: $(Tb_xY_{1-x})_2O_3$ wherein x is a number from 0.4 to 0.6, wherein the sintered body emits light when excited with excitation light of wavelength 380 nm, the light including a component of wavelength 545 nm which has a luminescent lifetime of at least 0.3 ms, and a specimen of 11 mm long made from the sintered body has an overall light transmittance of at least 81.0% at a wavelength of 1,064 nm.

In a further aspect, the invention provides a magneto-optical device comprising a Faraday rotator using the transparent complex oxide sintered body defined herein.

Advantageous Effects of Invention

The transparent complex oxide sintered body obtained by the invention is suited as an optical isolator material used in high-power optical isolators because trivalent terbium is contained in a fully high concentration and the content of tetravalent terbium is controlled to such a low level that light absorption attributable to tetravalent terbium is substantially negligible. Also, since the sintered body is an optical material having a high Verdet constant, magneto-optical devices of compact size may be fabricated. The sintered body may be used in the high-power application of at least 50 W.

BRIEF DESCRIPTION OF DRAWINGS

FIG. 2 is a diagram showing weight change versus heating temperature in Example 1-3.

FIG. 3 is a diagram obtained by temperature differentiation of the weight change of Example 1-3 in FIG. 2.

FIG. 4 is a diagram showing weight change versus heating temperature in Comparative Example 1-6.

PREFERRED EMBODIMENT OF INVENTION

Figure 1:
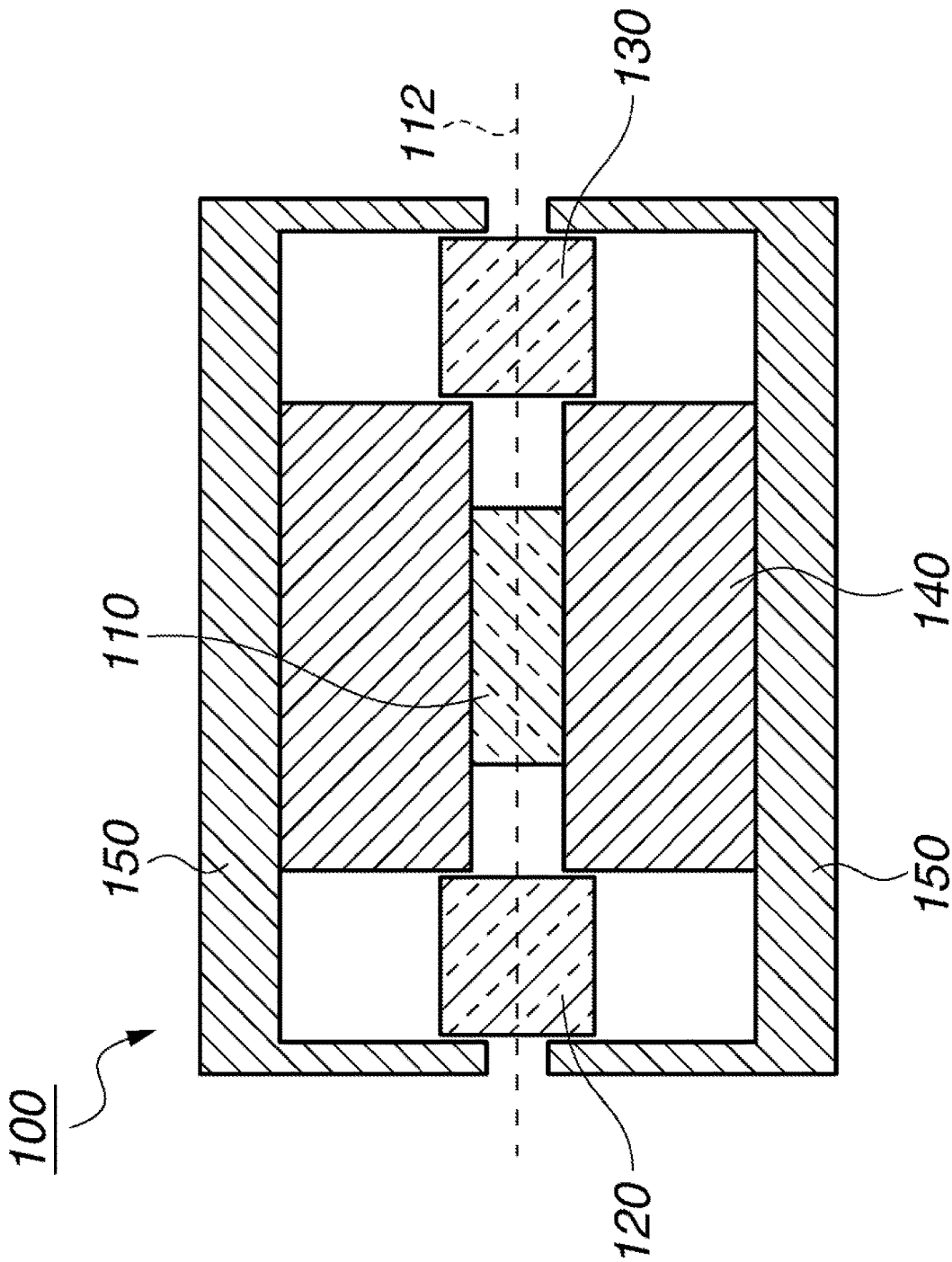
FIG. 1 is a schematic cross-sectional view of an optical isolator.

Method for Manufacturing Transparent Complex Oxide Sintered Body

One embodiment of the invention is a method for manufacturing a transparent complex oxide sintered body, comprising the steps of sintering a compact in an inert atmosphere or vacuum, and hot isostatic pressing (HIP) the sintered compact to form a transparent complex oxide sintered body. The compact is molded from a source powder based on a rare earth oxide represented by the compositional formula: $(Tb_xY_{1-x})_2O_3$ wherein x is a number from 0.4 to 0.6. A powder sample taken from the compact or a compact prepared under the same condition as the compact, when heated in air from room temperature, e.g., 1° C. to 40° C. at a heating rate of 15° C.·min, exhibits a weight gain of at least y % due to oxidative reaction starting from a temperature of at least 250° C., y being determined by the formula (I):

$$y=2x+0.3 \quad (I)$$

The sintered body emits light when excited with excitation light of wavelength 380 nm, the light including a component of wavelength 545 nm which has a luminescent lifetime of at least 0.3 ms. A specimen of 11 mm long made from the sintered body has an overall light transmittance of at least 81.0% at wavelength 1,064 nm.

Preparation of Compact

The compact is molded from a source powder composed mainly of a rare earth oxide comprising terbium oxide and yttrium oxide, wherein the molar fraction (mixing ratio) of terbium and yttrium is from 40 mol % to 60 mol % of terbium and the balance of yttrium. When a powder sample taken from the compact or a compact prepared under the same condition as the compact is heated in air from room temperature at a heating rate of 15° C./min, it exhibits a weight gain due to oxidative reaction starting from a temperature of at least 250° C. The weight gain (measured by thermogravimetry) due to oxidative reaction is at least y %, wherein y is determined by the formula (I): $y=2x+0.3$.

The compact may be prepared as follows.

Raw Powder

The raw materials used herein may be selected in accordance with a particular method for preparing the source powder, from rare earth metal powders containing terbium (Tb) and yttrium (Y), aqueous solutions thereof in nitric acid, hydrochloric acid, and sulfuric acid, and nitrates, halides and sulfides containing terbium (Tb) and yttrium (Y). The raw materials may have a purity of market level (at least 99.9% by weight), preferably at least 99.99% by weight.

The method for preparing the source powder using these raw materials is not particularly limited. The source powder ready for use may be prepared by any of dry milling, wet milling, co-precipitation, alkoxide hydrolysis, sol-gel, hydrothermal reaction, spray pyrolysis, and other synthesis processes.

While a transparent complex oxide ceramic material in the form of a complex oxide sintered body is finally manufactured by starting with a powder of oxides mixed in the desired ratio as the source powder, the shape and size of powder particles are not particularly limited.

To the source powder, an organic binder serving as a dispersant, binder or plasticizer may be added to impart the desired moldability.

Preferably the source powder used herein further contains an oxide of at least one element selected from Group 2 elements and Group 4 elements as a sintering aid. More preferably the source powder contains Zr oxide or Hf oxide as the sintering aid, for example.

To acquire high light transmittance, the sintering aid is preferably added in such an amount as to comply with the sintered body of complex oxide represented by the compositional formula: $(Tb_xY_{1-x})_2O_3$ wherein $0.4 \leq x \leq 0.6$. The amount of the sintering aid is preferably up to 3% by weight, more preferably up to 1% by weight as oxide based on the total weight (100% by weight) of main ingredient (oxide). The lower limit is preferably at least 0.5% by weight. The sintering aid should preferably have a purity of at least 99.9% by weight.

Where the sintering aid is not added, particles of spherical or generally cubic shape having a primary particle size of several tens to several hundreds of nanometers (nm) may be selected as the source powder. Particles with fine particle size and less anisotropy are preferable because they are sinterable enough to reach a high molded density so that a highly light transmissive complex oxide is readily obtained.

Preferably the source powder is prepared by the three-component co-precipitation process to be described below.

Three-Component Co-Precipitation Process

The source powder is typically prepared by furnishing an aqueous solution containing (a) terbium ions, (b) yttrium ions, and (c) ions of at least one element selected from Group 2 elements and Group 4 elements, for example, titanium, zirconium, hafnium, calcium and magnesium ions, which forms an oxide serving as the sintering aid for preventing precipitation of a heterophase other than cubic crystals in the crystal structure of terbium oxide-based complex oxide ceramic material, and letting components (a), (b) and (c) co-precipitate from the solution through the co-precipitation process. The resulting source powder contains a rare earth oxide consisting essentially of terbium oxide and yttrium oxide, specifically from 40 mol % to 60 mol % in molar fraction of terbium and the balance of yttrium, and the sintering aid consisting of the oxide of at least one element selected from Group 2 and Group 4 elements. This process is designated herein as three-component co-precipitation process.

As a typical three-component co-precipitation process, the source powder may be prepared by dissolving the predetermined raw materials so that components (a), (b) and (c) are contained in an acidic aqueous solution, for example, 5N nitric acid aqueous solution, adding an alkaline aqueous solution, for example, ammonia to the aqueous solution, letting components (a), (b) and (c) co-precipitate as hydroxide, filtering the precipitate, and oxidizing the co-precipitate. The precipitate-inducing means is not limited to the addition of an alkaline aqueous solution, and any desired precipitation means may be used as long as no disproportionation occurs during formation of co-precipitate of components (a), (b) and (c). For example, the method of adding oxalic acid to an acidic aqueous solution having components (a), (b) and (c) dissolved therein and letting the oxalate precipitate, or the method of adding a salt containing carbonate ions such as ammonium hydrogencarbonate or ammonium carbonate and letting the carbonate precipitate may be advantageously utilized. Further, the preferred treatment to obtain a powder of stable particle shape is, for example, by adding dropwise an alkaline aqueous solution such as aqueous ammonia to an acidic aqueous solution containing ions of three components, to form hydroxide, adding dropwise an aqueous solution of a carbonate ion-containing salt such as an ammonium hydrogencarbonate aqueous solution thereto, thereby once converting the hydroxide to carbonate, aging the solution, and thereafter, adding dropwise aqueous ammonia again for re-converting to hydroxide. With this treatment, the particles precipitate in stable particle shape without agglomeration.

The raw material for component (a) is preferably terbium oxide ($Tb_2O_3$) powder having a purity of preferably at least 99% by weight, more preferably at least 99.9% by weight or $Tb_4O_7$ powder having an equivalent purity. Alternatively, a powder of another compound such as fluoride or nitride of terbium may be used as long as the compound is dissolved in an acidic aqueous solution to form terbium ions, but not complex ions. Of these, terbium oxide powder is more preferred because impurity ions can have an impact on reaction, sintering or firing.

The raw material for component (b) is preferably yttrium oxide powder having a purity of preferably at least 99% by weight, more preferably at least 99.9% by weight. Alternatively, a powder of another compound such as fluoride or nitride of yttrium may be used as long as the compound is dissolved in an acidic aqueous solution to form yttrium ions, but not complex ions. Of these, yttrium oxide powder is more preferred because impurity ions can have an impact on reaction, sintering or firing.

The raw material for component (c) is preferably a powder of oxide of at least one element selected from Group 2 and Group 4 elements, having a purity of preferably at least 99% by weight, more preferably at least 99.9% by weight.

These raw materials are weighed in amounts corresponding to the composition of the transparent complex oxide sintered body finally obtained therefrom, and dissolved in an acidic aqueous solution. Specifically, first the raw material for component (a) and the raw material for component (b) are weighed in such amounts as to give the predetermined molar ratio as rare earth oxides. Subsequently, the raw material for component (c) is weighed in such an amount as to give the predetermined content of its oxide relative to the total weight of rare earth oxides. Notably, when all the raw materials for components (a), (b) and (c) are oxides and completely dissolve in an acidic aqueous solution, the ratio of the amounts of the raw materials as weighed directly lead to the weight ratio (in parts by weight) in the source powder resulting from the three-component co-precipitation process.

In dissolving the raw materials for components (a), (b) and (c) as weighed, the raw materials may be mixed together and the powder mixture be dissolved in an acidic aqueous solution, or the raw materials may be dissolved in an acidic aqueous solution in sequence.

The acidic aqueous solution used herein is not particularly limited as long as the raw materials for components (a), (b) and (c) are dissolvable therein without forming complex ions so that the solution may contain ions of components (a), (b) and (c). Examples include 5N nitric acid aqueous solution, sulfuric acid aqueous solution, and hydrochloric acid aqueous solution. An acidic aqueous solution which dissolves all the raw materials for three components completely is preferred, with nitric acid solution being more preferred. The nitric acid solution has the additional advantage that the amount of inorganic salts left after sintering or firing is small.

A precipitant may be added to the acidic aqueous solution containing ions of three components whereby all ions of three components co-precipitate. The precipitant is not particularly limited as long as it may be removed from the co-precipitate by water washing and filtration. Suitable precipitants include aqueous ammonia ($NH_4OH$), oxalic acid (($COOH)_2$), ammonium hydrogencarbonate ($NH_4HCO_3$), and ammonium carbonate (($NH_4)_2CO_3$). Of these, aqueous ammonia is most preferred because impurity ions are minimized.

The obtained co-precipitate is preferably subjected to the treatment of drying (heating at 100° C. or less; existing as co-precipitate) and/or firing (heating at 500 to 1,000° C. in an oxygen-containing atmosphere, typically air or oxygen atmosphere; oxide formation) to prevent to emit a large amount of moisture or gas therefrom during the subsequent heat treatment and prevent deterioration of the heat treatment furnace.

Then the co-precipitate or its oxide powder is preferably subjected to heat treatment including heating in an oxygen-containing atmosphere (typically air or oxygen atmosphere) at a temperature of from 800° C. to less than 1,200° C. and then cooling in an inert atmosphere, vacuum or reducing atmosphere. When the co-precipitate or its oxide powder is heated in air or oxygen atmosphere at a temperature of at least 800° C., a brown colored oxide powder containing tetravalent terbium is obtained. Now that the atmosphere is switched to an inert atmosphere, vacuum or reducing atmosphere in the cooling step, a white powder in which tetravalent terbium is depleted or minimized is obtained. The resulting white powder is advantageously utilized in that tetravalent terbium is depleted at the stage prior to sintering. That is, the heat treatment of the co-precipitate or its oxide powder intends to control the valence of terbium.

It is advantageous to mold the white powder in which tetravalent terbium is depleted because the influence of phase transition during sintering is minimized and the formation of cracks is suppressed.

In the heat treatment of the co-precipitate or its oxide powder, the atmosphere of the heating step is preferably an atmosphere containing at least 20 vol % of oxygen, for example, air or oxygen atmosphere. The heating temperature is preferably from 800° C. to less than 1,200° C., more preferably from 900° C. to 1,150° C., and even more preferably from 1,000° C. to 1,150° C. as the ultimate temperature. After the ultimate temperature is reached in the heating step, the powder may be immediately cooled or held at the temperature for a certain time, for example, about 1 to 5 hours.

After the heating step, the oxide powder is cooled, preferably in an oxygen-free atmosphere, typically an inert atmosphere (e.g., argon gas or nitrogen gas atmosphere), vacuum (oxygen reduced pressure) or reducing atmosphere (e.g., a mixed atmosphere of hydrogen and inert gas). The cooling step is carried out until the temperature reaches 350° C. or below. The cooling rate may be about 1.5 to 5° C./min, for example.

The oxide raw material obtained by the above procedure is a source powder which contains a rare earth oxide consisting essentially of (A) terbium oxide and (B) yttrium oxide, specifically from 40 mol % to 60 mol % in molar fraction of terbium and the balance of yttrium, and (C) the sintering aid consisting of the oxide of at least one element selected from Group 2 and Group 4 elements.

The source powder itself is not substantially different from conventional powder in physical properties such as particle shape and orientation, but characterized in that sintering reaction takes place uniformly at a microscopic level.

The source powder thus prepared has a purity of preferably at least 99% by weight, and for use in the optical application, a purity of more preferably at least 99.9% by weight, even more preferably at least 99.99% by weight.

Provided that the sum of (A) terbium oxide and (B) yttrium oxide is a molar ratio of 1 (100 mol %), the rare earth oxide consists of from 40 mol % to 60 mol %, preferably from 40 mol % to 50 mol % of (A) terbium oxide and the balance of (B) yttrium oxide. The source powder consists essentially of component (A), component (B) and component (C) or sintering aid.

A source powder based on (or composed mainly of) components (A) and (B) means that the total of oxides or components (A) and (B) is at least 90% by weight of the source powder. The total content of oxides or components (A) and (B) is preferably at least 95% by weight, more preferably at least 97% by weight.

Component (C) or sintering aid is an oxide of at least one element selected from Group 2 and Group 4 elements.

The sintering aid is preferably a compound which prevents precipitation of a heterophase other than cubic crystal in the crystal structure of terbium oxide-based complex oxide sintered body. Suitable sintering aids include oxides of Group 4 elements such as titanium, zirconium and hafnium, and oxides of Group 2 elements such as magnesium and calcium. A mixture of Group 4 element oxide and Group 2 element oxide is also acceptable. Since these oxides are not absorptive around wavelength 1.06 µm, they are suited for use in the transparent complex oxide sintered body of the invention. While the Group 4 element oxide is known as a stabilizer in the sintering of yttria, it is also effective as a stabilizer for the transparent complex oxide sintered body of the invention. It is noted that Group 2 elements such as magnesium and calcium have a high reaction activity because of strong ionic character so that they are readily incorporated in rare earth oxides as solid solution. Thus zirconium oxide and hafnium oxide are preferred as the sintering aid.

To the source powder, component (C) or sintering aid which prevents precipitation of a heterophase other than cubic crystal in the crystal structure of terbium oxide-based complex oxide sintered body, for example, oxide of Group 4 element such as titanium, zirconium or hafnium or oxide of Group 2 element such as magnesium or calcium is preferably added in an amount of from more than 0.5 part to 3 parts by weight, more preferably from 0.8 part to 3 parts by weight, even more preferably from 1 part to 3 parts by weight per 100 parts by weight of the rare earth oxide or total of components (A) and (B). Outside the range, the resulting transparent complex oxide sintered body may fail to meet one or more of the characteristics required as the magneto-optical device material. For example, when a specimen of 11 mm thick is made from the sintered body, the insertion loss at wavelength 1,064 nm inclusive of reflection loss at an end surface in thickness direction exceeds 0.97 dB.

It is noted that the Group 4 element oxide may be used alone or the Group 2 element oxide may be used alone, or the Group 4 element oxide and the Group 2 element oxide may be simultaneously used as the sintering aid. Since the Group 4 element forms a tetravalent ion and the Group 2 element forms a divalent ion, they are simultaneously added so that the rare earth oxide is doped in the form to compensate for the valence of total ions, or so-called charge compensation form, whereby ionic defects are minimized.

The source powder used in the first step should preferably have a primary particle size of 50 to 2,000 nm, more preferably 100 to 1,000 nm. If the primary particle size is less than 50 nm, such powder is difficult to handle, for example, difficult to mold, and a compact, if molded, has a low density and is susceptible to cracking because of a substantial shrinkage factor upon sintering. If the primary particle size exceeds 2,000 nm, such powder is less sinterable and thus difficult to produce a transparent sintered body having a high density. The primary particle size is determined as an average of lengths of 100 primary particles in an arbitrary field of view when observed under a scanning electron microscope or optical microscope.

Molding

The source powder as heat treated is then molded into a compact. For molding, a conventional press molding process may be used. For example, a standard pressing process of charging a mold with the source powder and pressing the powder in a certain direction or a cold isostatic press (CIP) process of charging a deformable water-proof container with the source powder in a sealed manner and applying an isostatic pressure may be used. The applied pressure is not particularly limited and may be adjusted as appropriate while monitoring the relative density of a compact being molded. In the molding step, another molding process such as cast molding may also be utilized.

Binder Burnout

The preparation of the compact may include a conventional binder burnout step. The compact as molded above is preferably subjected to binder burnout in a heating furnace. The atmosphere gas is preferably air or oxygen so that any organic substances may be decomposed.

In the embodiment wherein the white powder having tetravalent terbium depleted is used as the source powder, the burnout temperature is preferably up to 350° C., more preferably up to 300° C. because a burnout temperature in excess of 350° C. causes to oxidize trivalent terbium to tetravalent terbium.

The compact thus obtained meets the following condition as analyzed by thermogravimetry. When a powder sample taken from the compact or a compact prepared under the same condition as the compact is heated in air from room temperature at a heating rate of 15° C./min, it exhibits a weight gain due to oxidative reaction starting from a temperature of at least 250° C., and the weight gain is at least y % which is determined from the formula (I) using x in the compositional formula: $(Tb_xY_{1-x})_2O_3$.

$$y=2x+0.3 \quad (I)$$

The weight gain due to oxidative reaction may be determined by thermogravimetry using a differential thermobalance. Specifically, a portion is sampled from the compact (or an experimental compact prepared under the same conditions as that) excluding its outer peripheral surface, preferably from a central region (a region around the central axis in the case of a cylindrical compact) of the compact (or an experimental compact prepared under the same conditions as that), and ground on an agate mortar. The thus powdered sample is subject to differential thermal analysis for the measurement of a weight gain due to oxidative reaction. The sampled portion is ground until the sample becomes a fine uniform powder containing few coarse particles. Then the "weight gain due to oxidative reaction" is determined by heating the powdered sample at a heating rate of 15° C./min, determining a (percent) weight change, differentiating the weight change with respect to temperature, computing a peak area in a range of 250° C. to 500° C., and rounding the computed value to one decimal place. It is noted that since the incipient temperature for oxidative reaction varies in a temperature range of at least 250° C. depending on the composition of the compact, the incipient temperature is preferably confirmed on an actually measured curve of weight change. The heating rate may be a lower, but constant rate than 15° C./min.

The weight gain corresponds to the amount of oxygen taken in during oxidative reaction. In the case of Tb—Y—O base complex oxide, a higher weight gain means that trivalent terbium is richer in the compact. Although the upper limit of the weight gain due to oxidative reaction is not critical, the weight gain is typically up to 2.0%.

If the weight gain of the compact is below y % for some reason or other, tetravalent terbium is not completely removed even by carrying out reductive treatment after the subsequent sintering step, and the desired luminescent lifetime (i.e., transparency) is not obtainable. Thus it is preferred that at the compact stage, binder burnout be followed by reductive treatment. The conditions for the reductive treatment are not particularly limited as long as the weight gain is at least y %. Preferably the compact is treated in a reducing atmosphere at a heating temperature of 100° C. to 350° C.

According to the invention, the compact as prepared above is sintered and HIP treated, yielding a transparent complex oxide sintered body.

Sintering

In the manufacturing method of the invention, a standard sintering step may be advantageously utilized. That is, a heat sintering step relying on resistance heating or induction heating is advantageously utilized. The compact is sintered at a temperature of preferably at least 1,100° C., more preferably 1,200 to 1,800° C., even more preferably 1,400 to 1,800° C., and most preferably 1,400 to 1,600° C., obtaining a sintered body. If the sintering temperature is lower than 1,100° C., a transparent complex oxide sintered body is insufficiently consolidated, that is, the desired transparent complex oxide sintered body is not obtained.

The sintering atmosphere is not particularly limited as long as the atmosphere helps convert terbium oxide from $Tb_4O_7$ to $Tb_2O_3$, that is, non-oxidizing atmosphere. The atmosphere may be, for example, vacuum ($10^2$ Pa to $10^{-5}$ Pa), reducing atmosphere, or inert gas atmosphere. In the case of sintering in vacuum, a reduced pressure of $10^2$ Pa to $10^{-5}$ Pa may be employed. The sintering time is typically about 30 to about 480 minutes though it varies with the sintering temperature. Through the sintering step, the sintered body is preferably consolidated to a relative density of at least 90%.

HIP

According to the inventive method, the sintering step is followed by post-treatment, typically hot isostatic pressing (HIP). Particularly when the complex oxide sintered body does not develop light transmittance even at the end of the sintering step, the proceeding to HIP treatment is preferred because bubbles in the sintered body are eliminated and light transmittance is readily achievable. The pressing gas medium used herein may be an inert gas such as argon, or Ar—$O_2$. The applied pressure is conveniently up to 196 MPa because such pressure is manageable by a commercial HIP system. The treatment temperature may be set as appropriate depending on the sintered state of the compact. A temperature of at least 1,300° C. is desirable because no sufficient light transmittance is available at a too low treatment temperature.

Additional Steps

In the manufacturing method of the invention, the transparent complex oxide sintered body resulting from the sintering and HIP steps is preferably subjected to optical polishing at opposite end surfaces on an axis of optical utilization. The optical surface accuracy is preferably up to $\lambda/8$, more preferably up to $\lambda/10$ wherein $\lambda=633$ nm.

The opposite end surfaces of the sintered body as optically polished are then coated with an antireflective film which is designed to adjust the center wavelength to 1,064 nm. This ensures precise optical measurement.

The method of the invention is successful in manufacturing a transparent complex oxide sintered body containing no or little absorptive component derived from tetravalent terbium and having true light transmission.

Transparent Complex Oxide Sintered Body

Another embodiment of the invention is a transparent complex oxide sintered body manufactured by the inventive method. It is a sintered body of a complex rare earth oxide represented by the compositional formula: $(Tb_xY_{1-x})_2O_3$ wherein $0.4 \leq x \leq 0.6$. The sintered body emits light when excited with excitation light of wavelength 380 nm, the light including a component of wavelength 545 nm which has a luminescent lifetime of at least 0.3 ms. A specimen of 11 mm long made from the sintered body has an overall light transmittance of at least 81.0% at a wavelength of 1,064 nm. A high Verdet constant is available when x is at least 0.4. The phase transition of terbium is controllable when x is up to 0.6. Additionally, cracking during cooling after crystal growth is suppressed, and clouding of crystals is inhibited. Preferably, x is from 0.4 to 0.5 ($0.4 \leq x \leq 0.5$).

The transparent complex oxide sintered body contains a sintering aid composed of an oxide of at least one element selected from Group 2 and Group 4 elements as well as the rare earth oxide. The sintering aid is preferably an oxide of at least one element selected from titanium, zirconium, hafnium, calcium, and magnesium.

The sintering aid composed of such oxide is present in an amount of from more than 0.5 part to 3 parts by weight, more preferably from 0.8 part to 3 parts by weight, even more preferably from 1 part to 3 parts by weight per 100 parts by weight of the rare earth oxide. If the amount is no more than 0.5 part, the sintering aid effect is not consistently exerted and the insertion loss at wavelength 1,064 nm may exceed 0.97 dB. If the amount exceeds 3 parts, the sintering aid will precipitate out singly without forming a solid solution, causing laser beam scattering, and the insertion loss may exceed 0.97 dB.

The sintered body emits light when excited with excitation light of wavelength 380 nm, the light including a component of wavelength 545 nm which has a luminescent lifetime of at least 0.3 ms, preferably at least 0.4 ms. The light absorption attributable to tetravalent terbium is as low as a substantially negligible level. The transmittance at wavelength 1,064 nm which is expected of use in magneto-optical devices is high. When a laser beam of wavelength 1,064 nm having a diameter 1.6 mm is incident on the sintered body across an optical path length of 11 mm, no thermal lens effect takes place or only a thermal lens effect as low as practically acceptable takes place even on the incidence of high-power laser with an output of at least 50 W.

The luminescent lifetime is measured by setting an optically polished end surface of a sample as the measurement surface, irradiating excitation light of 380 nm, and measuring a luminescent component of wavelength 545 nm in the emitted light by the time-correlated single-photon counting (TCSPC) technique. Specifically, the sample takes the excited state upon exposure to the excitation light and resumes the ground state while releasing energy. Light is emitted at this point. A change-with-time $F(t)$ of luminescence intensity is given by the following formula:

$$F(t)=F_0 * \exp(-t/\tau)$$

wherein $F_0$ is a luminescence intensity at $t=0$ and $\tau$ is a luminescent lifetime (ms). Herein, a time giving $F(t)=1/eF_0$ (~37%) is the luminescent lifetime. The luminescent lifetime may be measured, for example, by a modular spectrofluorometer Fluorolog-3/TCSPC (Horiba, Ltd.).

It is noted for the measurement of a luminescent lifetime that since the position on the transparent complex oxide sintered body where a luminescent lifetime is measured, that is, the position on which the excitation light impinges is recommended to be close to the position where laser beam is to be incident, preferably measurement is made on an optically polished end surface. It is believed that impurities deposited during manufacture or defects are left on the outermost surface of the transparent complex oxide sintered body, and they can affect the luminescent lifetime. For this reason, measurement on the optically polished end surface is preferred although an outer peripheral portion as peripheral ground is acceptable.

Also, a specimen of 11 mm long (optical path length) made from the transparent complex oxide sintered body should have an overall light transmittance of at least 81.0%, preferably at least 81.1%, more preferably at least 81.2% at a wavelength of 1,064 nm.

As used herein, the "overall light transmittance" is measured on an optically polished specimen of transparent ceramic having a length (optical path length) of 11 mm with reference to JIS K7105 (ISO 13468-2:1999). Specifically, an integrating sphere is provided with an inlet opening and an outlet opening for light passage. A sample is placed at the inlet opening. A reflector is placed at the outlet opening. Then all light emerging from the sample is detectable by the integrating sphere. A component of overall light rays other than those in traveling direction is detected without removing the reflector at the outlet opening. A ratio of the intensity of the detected light to the intensity of incident light to the sample is the overall light transmittance.

Magneto-Optical Device

The transparent complex oxide sintered body of the invention is suited for use in magneto-optical devices. In particular, the sintered body is advantageously used as a Faraday rotator of an optical isolator which is used in a wavelength region of 0.9 to 1.1 μm.

FIG. 1 is a schematic cross-sectional view of an optical isolator as a typical magneto-optical device having a Faraday rotator. In FIG. 1, the optical isolator 100 comprises a Faraday rotator 110 of the transparent complex oxide sintered body, a polarizer 120 and an analyzer 130 of polarizing material arranged upstream and downstream of the Faraday rotator 110. In the optical isolator 100, polarizer 120, Faraday rotator 110 and analyzer 130 are arranged on an optical axis 112 in the order of 120-110-130, and preferably, a magnet 140 is rested on at least one side surface of those components. The magnet 140 is preferably received in a housing 150.

The isolator is preferably used in a fiber laser for a processing machine. Specifically, it is suitably used to prevent the laser light emitted by the laser component from being reflected back to the component to make its oscillation unstable.

EXAMPLE

Examples and Comparative Examples are given below for further illustrating the invention although the invention is not limited thereto.

Example 1

First, terbium oxide powder ($Tb_4O_7$, purity ≥99.9 wt %) and yttrium oxide powder ($Y_2O_3$, purity 99.9 wt %), both available from Shin-Etsu Chemical Co., Ltd., were furnished as raw materials for rare earth oxides, and weighed in such amounts that a ratio of Tb ions to Y ions might be 40:60, 50:50, and 60:40 (three levels). As a raw material for sintering aid, zirconium oxychloride octahydrate ($ZrClO.8H_2O$, purity 99.9 wt %, by Daiichi Kigenso Kagaku Kogyo Co., Ltd.) was weighed in such an amount as to give a content of 1.0 wt % based on the total weight of rare earth oxides. These raw materials were dissolved in 5N nitric acid aqueous solution.

Next, ammonium hydrogencarbonate was weighed in an amount of 3 equivalents relative to the total of rare earth ions and dissolved in deionized water. With stirring, the ammonium hydrogencarbonate aqueous solution was added dropwise to the aqueous solution having rare earth and zirconium ions dissolved therein. At the end of dropwise addition, aqueous ammonia was added dropwise in an amount of 1 equivalent relative to the total of rare earth ions so that the aqueous solution turned alkaline at pH 8-10 whereupon a mixture of rare earth carbonate and hydroxide co-precipitated.

The precipitate was collected by filtration, washed with ultrapure water, and dried at 75° C. for 2 days. The dry powder was heated at 1,100° C. in oxygen atmosphere, and then to cooled in Ar atmosphere, yielding a white to yellow source powder in which tetravalent terbium was depleted.

The source powder was dispersed in ethanol and milled on a ball mill with zirconia balls. An organic binder was added to the slurry, which was further milled. The binder-laden slurry was granulated through a spray dryer. The resulting granules were molded in a uniaxial press mold into a cylinder of diameter 7-8 mm, followed by cold isostatic pressing (CIP). In this way, ten-odd compacts were obtained.

The compacts thus obtained were subjected to binder burnout at 300° C. or 400° C. in air. Those compacts at the burnout temperature of 300° C. are regarded examples (Examples 1-1, 1-2, 1-3) while those compacts at the burnout temperature of 400° C. are comparative (Comparative Examples 1-1, 1-2, 1-3). The compacts were measured for a percent weight gain due to oxidative reaction by heating according to the following procedure.

Weight Gain Measurement

A sample was taken from each of the compacts of Examples 1-1 to 1-3 and Comparative Examples 1-1 to 1-3 and ground in a mortar. A platinum pan was filled with the ground powder. Differential thermal analysis was carried out using a thermogravimetry/differential thermal analysis (TG-DTA) balance (Thermo plus Evo, by Rigaku Corp.). While the sample was heated from room temperature to 1,000° C., a percent weight change was measured.

The measurement results of weight change of Example 1-3 were plotted in the diagram of FIG. 2. The weight change was measured both when the heating rate was 15° C./min and 5° C./min.

At either heating rate, a moderate weight loss was observed from room temperature to about 350° C., which was caused by the volatilization of adsorbed water and minute residual organic matter in the compact. At the heating rate of 15° C./min, a weight gain due to oxidative reaction was observed in a temperature range from about 350° C. to about 450° C. At the heating rate of 5° C./min, a similar weight gain was observed in a temperature range from about 300° C. to about 400° C.

Next, the weight changes in FIG. 2 were differentiated with respect to temperature, with the results shown in FIG. 3. There appeared peaks of upward convex shape having a maximum near 410° C. at the heating rate of 15° C./min or near 370° C. at the heating rate of 5° C./min. These peaks correspond to weight gains due to oxidative reaction.

With attention paid to the roots of the peak profile, each peak starts from about 290° C. and ends at about 450° C. It is then possible to compute a percent weight gain due to oxidative reaction by determining the area of each peak in a region including the overall range from 290° C. to 450° C. by integration. The peak areas thus determined are 1.53% at the heating rate of 15° C./min and 1.51% at the heating rate of 5° C./min, indicating that they are well coincident at an accuracy of two significant figures even though the heating rate is different.

Then, the "(percent) weight gain due to oxidative reaction" is determined by heating a powdered sample at a heating rate of 15° C./min, determining a weight change, differentiating the weight change with respect to temperature, computing a peak area in a range of 250° C. to 500° C., and rounding the computed value to one decimal place.

The compact as molded above was sintered in a vacuum furnace under a vacuum of $5 \times 10^{-2}$ Pa or lower at a temperature of 1,400 to 1,600° C. for 3 hours. The sintered body was subjected to hot isostatic pressing (HIP) at a temperature of 1,600° C. and a pressure of 200 MPa for 3 hours, yielding a ceramic sintered body (complex oxide sintered body) having a diameter of 6 mm.

The ceramic sintered body was ground and polished to a length of 11.5 mm. The optical end surfaces of each sample were subjected to final optical polishing at an optical surface accuracy of $\lambda/8$ (wherein $\lambda=633$ nm), to a length of 11.0 mm.

The specimen thus obtained was measured for several properties.

Measurement of Overall Light Transmittance

An overall light transmittance was determined by means of a UV/Vis spectrometer (V-670 by JASCO Corp.) by reflecting light in multiple ways in an integrating sphere unit whose inner wall was coated with a high reflectance liner so that light is made uniform, and measuring the intensity of light collected by trapping even light scattered by the turbidity of the specimen (exclusive of backward scattering and lateral scattering), and computing according to the formula:

$$\text{overall light transmittance} = I/I_0 \times 100$$

wherein I is the intensity of transmitted light (the intensity of light transmitted by a specimen of 11 mm long) and $I_0$ is the intensity of incident light. The light is of wavelength 1,064 nm.

Measurement of Luminescent Lifetime

A luminescent lifetime was measured by a modular spectrofluorometer Fluorolog-3/TCSPC (Horiba, Ltd.). The measurement surface is an optically polished end surface. Using excitation light of 380 nm, a lifetime is measured with respect to a luminescent component of wavelength 545 nm. The specimen takes the excited state upon exposure to the excitation light and resumes the ground state while releasing energy. Light is emitted at this point. A change-with-time F(t) of luminescent intensity is given by the following formula:

$$F(t) = F_0 * \exp(-t/\tau)$$

wherein $F_0$ is a luminescent intensity at t=0 and $\tau$ is a luminescent lifetime (ms). That is, a time giving $F(t)=1/eF_0$ (~37%) is the lifetime.

Antireflective Film

For measurement of thermal lens effect and incorporation in an isolator as Faraday rotation material, the optical end surfaces of a specimen were coated with an antireflective film which was designed so as to adjust the center wavelength to 1,064 nm. Since a refractive index differs with a particular composition, a suitably tailored antireflective film was coated.

Measurement of Thermal Lens Effect (Measurement of the Maximum of Input Power Below Which the Thermal Lens Effect Does Not Occur)

Using a high-power laser (IPG Photonics Corp.) with a beam diameter of 1.6 mm, high-power laser light of wavelength 1,064 nm is emitted as spatial light with a beam diameter of 1.6 mm. A beam waist position F0 (m) is measured by a beam profiler. Thereafter, a specimen is placed in the spatial optical system, and a beam waist position F1 (m) of emergent light is similarly measured. A change (ΔF) of beam waist position is represented by the following formula.

$$\Delta F(m) = F0 - F1$$

It is noted that the change ΔF becomes larger as the input laser power increases. The maximum input laser powder (W) giving ΔF=0.1 m or less is determined as the value below which the thermal lens effect is negligible, that is, the maximum of input power below which the thermal lens effect does not occur. In Tables, this is reported as thermal lens effect.

Comparative Examples 1-4, 1-5 and 1-6

Source powders were prepared under the same conditions as in Examples 1-1 to 1-3 while the yttrium content was varied at three levels. In the heat treatment of the dry powder, the temperature was 1,100° C. and the atmosphere was an oxygen atmosphere in both the heating and cooling steps. The source powder was brown colored and contained tetravalent terbium.

Thereafter, samples of ceramic sintered bodies (complex oxide sintered bodies) were prepared under the same conditions as in Examples 1-1 to 1-3. Specifically, the source powder was dispersed in ethanol and milled on a ball mill with zirconia balls. An organic binder was added to the slurry, which was further milled. The binder-laden slurry was granulated through a spray dryer. The resulting granules were molded in a uniaxial press mold into a cylinder of diameter 7-8 mm. By CIP, ten-odd compacts were obtained. The compacts thus obtained were subjected to binder burnout at 400° C. in air to remove the organic binder.

A sample was taken from the burnout compact and ground in a mortar as in Examples and other Comparative Examples. A platinum pan was filled with the ground powder. Differential thermal analysis was carried out using a TG-DTA balance (Thermo plus Evo, by Rigaku Corp.). The measurement conditions were the same as in Examples and other Comparative Examples. While the sample was heated from room temperature to 1,000° C. at a heating rate of 15° C./min, a percent weight change was measured. The "weight gain due to oxidative reaction" was determined by the same procedure as above.

The measurement results of weight change of Comparative Example 1-6 were plotted in the diagram of FIG. 4. A weight gain starting from about 350° C. as found in FIG. 2 (Example 1-3) was not observed.

Next, the compact as molded above was sintered in a vacuum furnace under a vacuum of $5\times10^{-2}$ Pa or lower at a temperature of 1,400 to 1,600° C. for 3 hours. The sintered body was subjected to HIP at 1,600° C. and 200 MPa for 3 hours, yielding a ceramic sintered body having a diameter of 6 mm. The ceramic sintered body was ground and polished to a length of 11.5 mm. The optical end surfaces of each sample were subjected to final optical polishing at an optical surface accuracy of $\lambda/8$ (wherein $\lambda=633$ nm), to a length of 11.0 mm. The specimen thus obtained was measured for overall light transmittance, luminescent lifetime and thermal lens effect.

The results are tabulated in Tables 1, 2 and 3. In the Tables, x is a value of x in the compositional formula: $(Tb_xY_{1-x})_2O_3$ of the rare earth oxide, and y is computed from $y=2x+0.3$ by substituting the value of x.

TABLE 1

| | | | Example | | |
|---|---|---|---|---|---|
| | | | 1-1 | 1-2 | 1-3 |
| Source powder | Terbium oxide | Molar ratio (%) | 40 | 50 | 60 |
| | Yttrium oxide | Molar ratio (%) | 60 | 50 | 40 |
| | | x | 0.4 | 0.5 | 0.6 |
| | Sintering aid | Type | $ZrO_2$ | $ZrO_2$ | $ZrO_2$ |
| | | Content (wt %) | 1 | 1 | 1 |
| Steps | Source powder preparation | | 3-component co-precipitation | 3-component co-precipitation | 3-component co-precipitation |
| | Powder heat treatment | Temperature (° C.) | 1,100 | 1,100 | 1,100 |
| | | Heating atmosphere | oxygen | oxygen | oxygen |
| | | Cooling atmosphere | Ar | Ar | Ar |
| | Binder burnout | Temperature (° C.) | 300 | 300 | 300 |
| | | Atmosphere | air | air | air |
| | Compact | Weight gain (%) due to oxidative reaction | 1.1 | 1.3 | 1.5 |
| | | y | 1.1 | 1.3 | 1.5 |
| | Sintering | Temperature (° C.) | 1,400 | 1,400 | 1,600 |
| | | Time (hr) | 3 | 3 | 3 |
| | | Atmosphere | vacuum | vacuum | vacuum |
| | HIP | Temperature (° C.) | 1,600 | 1,600 | 1,600 |
| | | Time (hr) | 3 | 3 | 3 |
| | | Pressure (MPa) | 200 | 200 | 200 |
| Test results | Overall light transmittance (%) | | 81.4 | 81.3 | 81.1 |
| | Luminescent lifetime (ms) | | 0.50 | 0.45 | 0.39 |
| | Thermal lens effect (W) | | 70 | 60 | 60 |

TABLE 2

| | | | Comparative Example | | |
|---|---|---|---|---|---|
| | | | 1-1 | 1-2 | 1-3 |
| Source powder | Terbium oxide | Molar ratio (%) | 40 | 50 | 60 |
| | Yttrium oxide | Molar ratio (%) | 60 | 50 | 40 |
| | | x | 0.4 | 0.5 | 0.6 |
| | Sintering aid | Type | $ZrO_2$ | $ZrO_2$ | $ZrO_2$ |
| | | Content (wt %) | 1 | 1 | 1 |
| Steps | Source powder preparation | | 3-component co-precipitation | 3-component co-precipitation | 3-component co-precipitation |
| | Powder heat treatment | Temperature (° C.) | 1,100 | 1,100 | 1,100 |
| | | Heating atmosphere | oxygen | oxygen | oxygen |
| | | Cooling atmosphere | Ar | Ar | Ar |

TABLE 2-continued

|  |  |  | Comparative Example | | |
|---|---|---|---|---|---|
|  |  |  | 1-1 | 1-2 | 1-3 |
|  | Binder burnout | Temperature (° C.) | 400 | 400 | 400 |
|  |  | Atmosphere | air | air | air |
|  | Compact | Weight gain (%) due to oxidative reaction | 1.0 | 1.2 | 1.3 |
|  |  | y | 1.1 | 1.3 | 1.5 |
|  | Sintering | Temperature (° C.) | 1,400 | 1,400 | 1,600 |
|  |  | Time (hr) | 3 | 3 | 3 |
|  |  | Atmosphere | vacuum | vacuum | vacuum |
|  | HIP | Temperature (° C.) | 1,600 | 1,600 | 1,600 |
|  |  | Time (hr) | 3 | 3 | 3 |
|  |  | Pressure (MPa) | 200 | 200 | 200 |
| Test results | Overall light transmittance (%) |  | 81.0 | 80.9 | 80.7 |
|  | Luminescent lifetime (ms) |  | 0.22 | 0.20 | 0.17 |
|  | Thermal lens effect (W) |  | 40 | 40 | 40 |

TABLE 3

|  |  |  | Comparative Example | | |
|---|---|---|---|---|---|
|  |  |  | 1-4 | 1-5 | 1-6 |
| Source powder | Terbium oxide | Molar ratio (%) | 40 | 50 | 60 |
|  | Yttrium oxide | Molar ratio (%) | 60 | 50 | 40 |
|  |  | x | 0.4 | 0.5 | 0.6 |
|  | Sintering aid | Type | $ZrO_2$ | $ZrO_2$ | $ZrO_2$ |
|  |  | Content (wt %) | 1 | 1 | 1 |
| Steps | Source powder preparation |  | 3-component co-precipitation | 3-component co-precipitation | 3-component co-precipitation |
|  | Powder heat treatment | Temperature (° C.) | 1,100 | 1,100 | 1,100 |
|  |  | Heating atmosphere | oxygen | oxygen | oxygen |
|  |  | Cooling atmosphere | oxygen | oxygen | oxygen |
|  | Binder burnout | Temperature (° C.) | 400 | 400 | 400 |
|  |  | Atmosphere | air | air | air |
|  | Compact | Weight gain (%) due to oxidative reaction | 0 | 0 | 0 |
|  |  | y | 1.1 | 1.3 | 1.5 |
|  | Sintering | Temperature (° C.) | 1,400 | 1,400 | 1,600 |
|  |  | Time (hr) | 3 | 3 | 3 |
|  |  | Atmosphere | vacuum | vacuum | vacuum |
|  | HIP | Temperature (° C.) | 1,600 | 1,600 | 1,600 |
|  |  | Time (hr) | 3 | 3 | 3 |
|  |  | Pressure (MPa) | 200 | 200 | 200 |
| Test results | Overall light transmittance (%) |  | 80.8 | 80.7 | 80.7 |
|  | Luminescent lifetime (ms) |  | 0.11 | 0.12 | 0.11 |
|  | Thermal lens effect (W) |  | 35 | 40 | 40 |

As seen from Table 1, all samples of Examples experience a weight gain of at least y % which is computed from formula (I) by substituting the value of x in the compositional formula: $(Tb_xY_{1-x})_2O_3$ and have a long luminescent lifetime of at least 0.3 ms. The samples having a long luminescent lifetime are of sufficient optical quality to operate at a thermal lens effect (power) of at least 50 W. In contrast, the samples of Comparative Examples in Tables 2 and 3 have a weight gain of less than y %, a luminescent lifetime of shorter than 0.3 ms, and a thermal lens effect (power) of 40 W or less. Examples show improvements in overall light transmittance and thermal lens effect over Comparative Examples.

The reason why the weight gain of y % is the boundary condition is correlated to the high-temperature phase of terbium oxide. Terbium oxide assumes a high oxidation state from $Tb_2O_3$ to $TbO_2$. In a high-temperature region, α-phase assuming a C-type structure exists from $TbO_{1.5}$ to approximately $TbO_{1.7}$, and α-phase assuming another fluorite type structure exists in the high oxidation state from $TbO_{1.72}$ and higher. When an oxide of α-phase is cooled, it turns to an oxide containing anion defects originating from the fluorite phase in any structural aspect. When an oxide of α-phase is cooled, the anion defect-containing oxide of the same type is not created. In this regard, it is believed that $TbO_{1.7}$ is correlated to the weight gain of y %. When the weight gain is equal to or greater than y %, the oxide approaches $TbO_{1.5}$ rather than $TbO_{1.7}$ and eventually enters α-phase if not oxidized in the subsequent manufacturing steps. Then the oxide becomes of optical quality free of anion defects.

The sintered bodies of Examples 1-1 to 1-3 are advantageously used as Faraday rotation material. The sintered body can be utilized as an optical isolator by placing a polarizer and an analyzer at the opposite end surfaces and enclosing the side surface with a magnet as shown in FIG. 1.

Japanese Patent Application No. 2018-043046 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a transparent complex oxide sintered body comprising the steps of:
    providing a source powder comprising a rare earth oxide represented by the compositional formula: $(Tb_xY_{1-x})_2O_3$ wherein x is a number from 0.4 to 0.6, and a sintering aid comprising an oxide of at least one element selected from Group 2 elements and Group 4 elements, the source powder being prepared by:
        furnishing an aqueous solution containing (a) terbium ions, (b) yttrium ions, and (c) ions of at least one element of the sintering aid, letting components (a), (b) and (c) co-precipitate from the solution, filtering and oxidizing the co-precipitate, and
        heat treating the oxidized co-precipitate or an oxide thereof by heating in an oxygen-containing atmosphere at a temperature of from 800° C. to less than 1,200° C. and then cooling in an inert atmosphere, vacuum or reducing atmosphere down to 350° C. or below, and
    molding a compact from the source powder;
    wherein a powder sample taken from the compact or a compact prepared under the same condition as the compact, when heated in air from room temperature at a heating rate of 15° C./min, exhibits a weight gain of at least y % due to oxidative reaction starting from a temperature of at least 250° C., y being determined by the formula (I):

$$y=2x+0.3 \quad (I),$$

and
    wherein x is the number from 0.4 to 0.6,
    sintering the molded compact in an inert atmosphere or vacuum;
    hot isostatic pressing (HIP) the sintered compact to form a transparent complex oxide sintered body,
    wherein when excited with excitation light of wavelength 380 nm, the transparent complex oxide sintered bod emits light including a component of wavelength 545 nm which has a luminescent lifetime of at least 0.3 ms, and a specimen of 11 mm long made from the sintered body has an overall light transmittance of at least 81.0% at a wavelength of 1,064 nm.

2. The method of claim 1, further comprising, after the molding step, subjecting the molded compact to binder burnout at a temperature of up to 350° C.

3. The method of claim 2, further comprising, after the burnout step, subjecting the compact to reducing treatment in a reducing atmosphere at a temperature of 100° C. to 350° C.

4. The method according to claim 1, wherein in the heat treating step, the oxygen-containing atmosphere is an atmosphere containing at least 20 vol % oxygen.

5. The method according to claim 1, wherein in the heat treating step, the oxidized co-precipitate or the oxide thereof is heated at a temperature of from 900° C. to 1,150° C.

6. The method according to claim 2, wherein the binder burnout is performed at a temperature of up to 300° C.

7. The method according to claim 1, wherein the sintering aid is included at from 1 part to 3 parts by weight per 100 parts by weight of the rare earth oxide.

8. The method according to claim 1, wherein the sintering aid is selected from the group consisting of zirconium oxide and hafnium oxide.

9. The method according to claim 1, wherein in the sintering step, the molded compact is sintered at a temperature of 1,400 to 1,600° C.

10. A transparent complex oxide sintered body obtained by the method according to claim 1,
    wherein the transparent complex oxide sintered body comprises a rare earth oxide represented by the compositional formula: $(Tb_xY_{1-x})_2O_3$,
    wherein x is a number from 0.4 to 0.6,
    wherein when excited with excitation light of wavelength 380 nm, the transparent complex oxide sintered body emits light including a component of wavelength 545 nm which has a luminescent lifetime of at least 0.3 ms, and a specimen of 11 mm long made from the sintered body has an overall light transmittance of at least 81.0% at a wavelength of 1,064 nm.

11. The transparent complex oxide sintered body according to claim 10, wherein x is a number from 0.4 to 0.5.

12. The transparent complex oxide sintered body according to claim 10, wherein the overall light transmittance at a wavelength of 1,064 nm is at least 81.2%.

13. A magneto-optical device comprising a Faraday rotator using the transparent complex oxide sintered body of claim 10.

* * * * *